United States Patent
Kamei et al.

(10) Patent No.: US 8,388,752 B2
(45) Date of Patent: Mar. 5, 2013

(54) METHOD OF MANUFACTURING A SILICON CARBIDE SINGLE CRYSTAL

(75) Inventors: Kazuhito Kamei, Hyogo (JP);
Kazuhiko Kusunoki, Amagasaki (JP);
Nobuyoshi Yashiro, Amagasaki (JP);
Akihiro Yauchi, Nishinomiya (JP);
Shinji Shimosaki, Amagasaki (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 122 days.

(21) Appl. No.: 13/036,101

(22) Filed: Feb. 28, 2011

(65) Prior Publication Data
US 2011/0200833 A1   Aug. 18, 2011

Related U.S. Application Data

(63) Continuation of application No. PCT/JP2009/065083, filed on Aug. 28, 2009.

(30) Foreign Application Priority Data

Aug. 29, 2008 (JP) ................... 2008-221852

(51) Int. Cl.
*C30B 9/00* (2006.01)
(52) U.S. Cl. .............. 117/73; 117/54; 117/65; 117/78; 117/951
(58) Field of Classification Search ............ 117/54, 117/64, 65, 73, 78, 951; 257/77
See application file for complete search history.

(56) References Cited

U.S. PATENT DOCUMENTS

2007/0069216 A1* 3/2007 Komiyama et al. ............. 257/77

FOREIGN PATENT DOCUMENTS

| JP | 2000-264790 | 9/2000 |
|----|-------------|--------|
| JP | 2007-076986 | 3/2007 |
| JP | 2007-261843 | 10/2007 |
| JP | 2007-261844 | 10/2007 |
| JP | 2008-100890 | 5/2008 |

OTHER PUBLICATIONS

Nava F. et al., "Topical Review: Silicon carbide... detector material", Measurement Science and Technology, IOP, Bristol, GB, vol. 19, No. 10, Aug. 11, 2008, p. 102001, XP020144236.
Dmitriev et al., "Silicon carbide... liquid-phase epitaxy", Physica B. Condensed Matter, Amsterdam, NL, vol. 185, No. 1-4, Apr. 1, 1993, pp. 440-452, XP024467855.
Munch W. V. et al., "Silicon carbide... phase epitaxy", Solid State Electronics, Elsevier Science Publishers, Barking, GB, vol. 21, Jan. 1, 1978, pp. 1129-1132, XP002523966.
W.E. Nelson, "Growth and Properties... Single Crystals", Journal of Applied Physics, vol. 37, No. 1, Jan. 1, 1966, pp. 333, XP55009214.
Dmitriev V. et al., "Growth of SIC... Liquid Phase Epitaxy", Journal of Crystal growth, Elsevier, Amsterdam, NL, vol. 128, No. 1/04, Mar. 1, 1993, pp. 343-348.
Materials Science Forum, vols. 338-342 (2000), pp. 229-232.
Journal of Crystal Growth 128 (1993), pp. 343-348.

* cited by examiner

*Primary Examiner* — Matthew Song
(74) *Attorney, Agent, or Firm* — Clark & Brody

(57) ABSTRACT

A method capable of stably manufacturing a SiC single crystal in the form of a thin film or a bulk crystal having a low carrier density of at most $5\times10^{17}/cm^3$ and preferably less than $1\times10^{17}/cm^3$ and which is suitable for use in various devices by liquid phase growth using a SiC solution in which the solvent is a melt of a Si alloy employs a Si alloy having a composition which is expressed by $Si_xCr_yTi_z$ wherein x, y, and z (each in atomic percent) satisfy $$0.50<x<0.68, 0.08<y<0.35, \text{ and } 0.08<z<0.35, \text{ or} \quad (1)$$

$$0.40<x\leq0.50, 0.15<y<0.40, \text{ and } 0.15<z<0.35. \quad (2)$$

x, y, and z preferably satisfy $0.53<x<0.65$, $0.1<y<0.3$, and $0.1<z<0.3$.

4 Claims, 1 Drawing Sheet

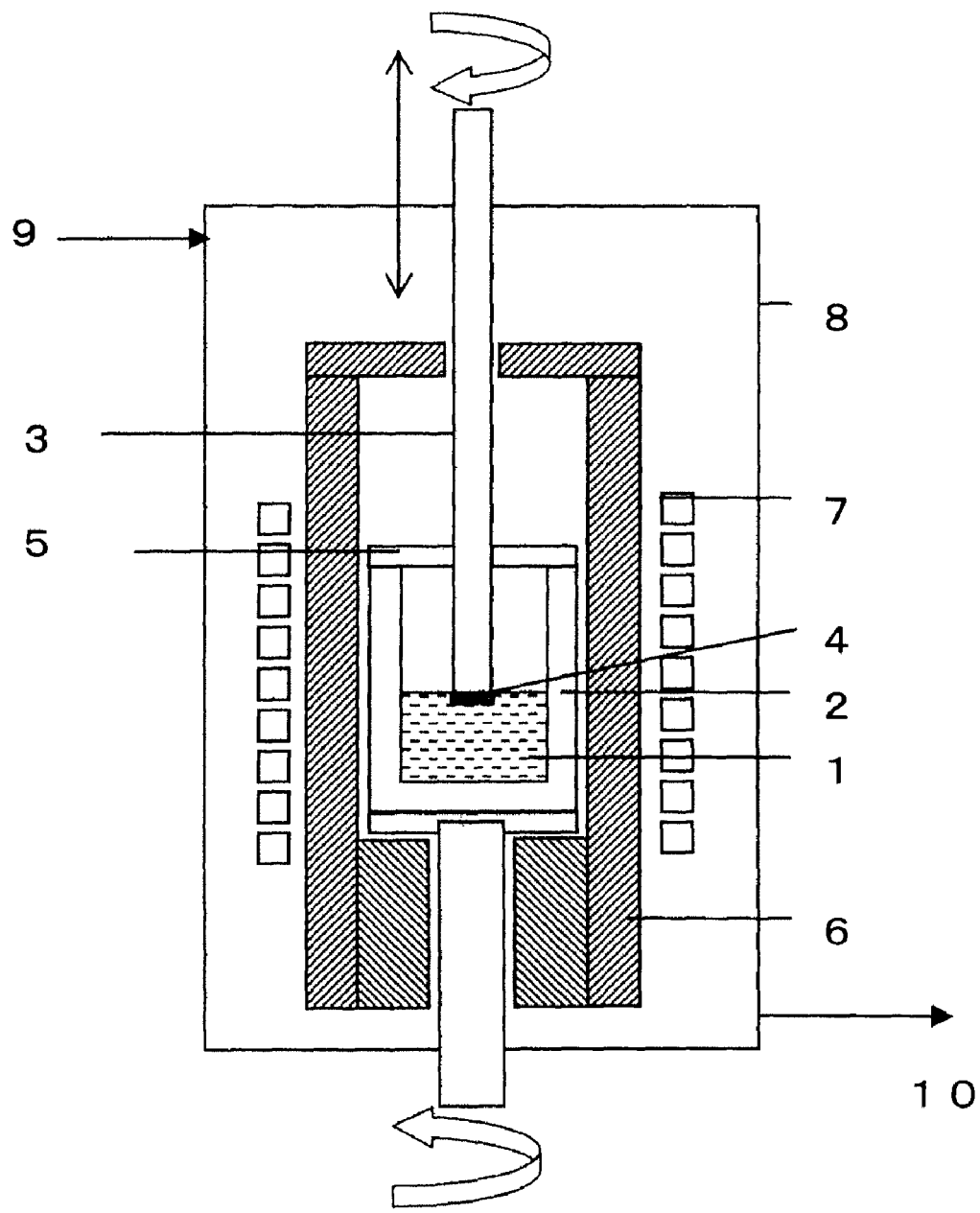

METHOD OF MANUFACTURING A SILICON CARBIDE SINGLE CRYSTAL

TECHNICAL FIELD

This invention relates to a method of manufacturing silicon carbide (SiC). A method according to the present invention can be applied to the manufacture of SiC single crystal substrates and SiC epitaxial wafers which are particularly suitable for electronic devices, optical devices, and the like.

BACKGROUND ART

Silicon carbide (SiC) has advantageous physical properties such as a wide band gap, a high thermal conductivity, and a low dielectric constant, which make it possible to realize semiconductor devices having a lower operational loss and a high resistance to temperature than silicon (Si) semiconductor devices. As a result, it is expected that silicon carbide can be used in a wide range of applications including as a material for power devices for electric power control, as a material for high frequency devices having high breakdown voltages, as a material for environmentally resistant devices for use in high temperature environments, as a material for radiation-resistant devices, and the like.

Each of these applications requires a high quality SiC single crystal and particularly a single crystal substrate having a diameter of at least 2 inches, and more specifically a SiC epitaxial wafer which comprises a SiC single crystal substrate having thereon an epitaxially grown SiC single crystal thin film which forms an active layer of a device.

The liquid phase epitaxy (LPE) method is known to form a SiC single crystal thin film having good crystalline quality. In the LPE method, first, carbon is dissolved in a melt of Si or a Si alloy to prepare a SiC solution having C (carbon) dissolved in the melt which serves as a solvent to a concentration close to its saturation point. A substrate as a seed crystal such as a substrate of a SiC single crystal is immersed in this SiC solution, and a supersaturated state of SiC is formed in the solution by creating a supercooled condition of the solution at least in the vicinity of the substrate, thereby causing epitaxial growth of a SiC single crystal on the substrate. This method can also be used to grow a SiC bulk single crystal. In this case, the crystal growth method is referred to as the solution growth method. Below, the LPE method and the solution growth method will collectively be referred to as the liquid phase growth method.

The LPE method, which is a liquid phase growth method, can have a higher film forming speed compared to the CVD method, which is a vapor phase growth method which is also capable of growth of a high quality SiC single crystal. In addition, in contrast to the CVD method which usually uses a so-called off-axis substrate in which the c axis is inclined, the LPE method has the advantage that the crystal orientation of the substrate is not limited so that it is possible to use a so-called on-axis substrate in which the c axis is not inclined. Use of an off-axis substrate is disadvantageous since it is known to have a tendency to easily introduce defects such as lattice defects into the single crystal being grown.

When application to an electronic device is contemplated, it is necessary to adjust the electrical conductivity of a SiC single crystal by controlling the carrier density thereof. For example, when a SiC single crystal thin film formed on a substrate is used as an active layer of a power device such as a MOSFET (Metal-Oxide-Semiconductor Field-Effect Transistor), it is necessary to control the carrier density in the SiC single crystal to a desired value within the range of $10^{15}/cm^3$ to $10^{16}/cm^3$. When a SiC bulk single crystal is used as a substrate of a light emitting element (a thin film of GaN or the like is grown on the substrate), it is desirable to make the carrier density on the order of $10^{17}/cm^3$ and to make the crystal transparent so that light can be emitted from its rear surface.

In the case of film formation of an active layer of a SiC single crystal by a vapor phase growth method such as the CVD method, carrier control is relatively easy since a SiC single crystal is grown under a reduced pressure in a glass vessel using high purity raw material gases.

However, growth of a SiC single crystal by the liquid phase growth method which uses a melt is usually carried out at atmospheric pressure in order to minimize vaporization of the melt, thereby making it difficult to control the carrier density of a SiC single crystal with good reproducibility. This is because in a SiC single crystal obtained by the liquid phase growth method, nitrogen gas which remains in a crystal growth chamber due to adsorption by a heat insulating material or the like unavoidably penetrates into the SiC single crystal being grown and replaces carbon sites of the crystal. As a result, the concentration of nitrogen atoms in the grown SiC single crystal reaches a level from $10^{18}/cm^3$ to $10^{19}/cm^3$. Furthermore, the resulting single crystal is strongly colored, and in general, it has a deep green color.

In a SiC semiconductor, nitrogen acts as a carrier in the form of an electron donor. Therefore, the carrier density increases as the nitrogen concentration increases. Accordingly, the above nitrogen concentration level indicates that the carrier density greatly exceeds the above-described preferred range. As a result, a SiC single crystal thin film grown by the LPE method and a SiC single crystal obtained by the solution growth method both have too high a carrier density, and they always exhibit a low specific resistivity on the order of several tens of milliohm-centimeter.

As described above, a SiC single crystal which is obtained by liquid phase growth is colored since it has a high carrier density due to incorporation of a large amount of nitrogen. Therefore, when a SiC single crystal obtained by the solution growth method is used as a substrate for a light emitting element, there is another problem in that it is difficult to discharge light from the rear surface of a substrate by the so-called flip chip mounting technique, and the SiC single crystal cannot be used as a substrate for lighting unit.

In addition, when a SiC thin film is used as an active layer of a power device such as a MOSFET, the SiC film becomes unsuitable for use as an active layer when the carrier density reaches a high level of $10^{18}/cm^3$ or greater. Therefore, it is necessary for the SiC thin film deposited by the LPE method to again deposit thereon a SiC active layer having a thickness of several micrometers and a controlled carrier density by the CVD method or the like.

In this manner, with conventional liquid phase growth techniques for growing a SiC single crystal, since incorporation of nitrogen cannot be controlled, it was not possible to grow a SiC single crystal film having a suitable carrier density for an active layer of a power device on a substrate. In addition, because coloration was unavoidable, a bulk SiC single crystal manufactured for use as substrate could only be used in applications as a colored electrically conducting substrate, which made its uses extremely limited.

In below-identified Non-Patent Document 1, it is reported that growth of a SiC thin film with a low carrier density of $2 \times 10^{16}/cm^3$ was realized by growing a SiC single crystal by the LPE method (using molten Si as a solvent) in a graphite crucible under a reduced pressure of $5 \times 10^{-4}$ Pa. However, in liquid phase growth under a reduced atmosphere, because the melt which acts as a solvent evaporates in a short period of time, it is not possible to stably carry out crystal growth over a prolonged period.

In below-identified Non-Patent Document 2, it is reported that a low carrier density of $8 \times 10^{15}/cm^3$ could be achieved by allowing a SiC solution in a solvent of a Si melt to heave by application of electromagnetic force so that the contact of the solution with the vessel wall is prevented and performing growth of a SiC single crystal in that condition under a reduced pressure of $5 \times 10^{-5}$ torr. However, even in that method, because crystal growth is carried out under a reduced pressure, as described above, vaporization of the melt is unavoidable. Furthermore, because the melt is held in a heaved state by application of electromagnetic force, there is a limit to the weight of the melt that can be used, and it is difficult to grow a SiC single crystal film on a large substrate with a diameter of at least 2 inches.

Below-identified Patent Document 1 proposes a method of manufacturing a SiC single crystal by the LPE method using a SiC solution formed from a melt consisting of Si, C, and at least one transition metal (the solvent is a Si-transition metal alloy). That method is intended to enable the manufacture of a bulk single crystal (self-supporting crystals) of SiC with an increased growth speed, and there is no description concerning decreasing the carrier density or suppressing coloration of a SiC single crystal. Furthermore, the only actual examples of transition metals which are used in the examples are Mo, Cr, or Co used individually (namely, the solvent is a Si—Mo, Si—Cr, or Si—Co alloy).

PRIOR ART DOCUMENTS

Non-Patent Documents
  Non-Patent Document 1: Materials Science Forum, Volumes 338-342 (2000), pages 229-232;
  Non-Patent Document 2: Journal of Crystal Growth 128 (1993), pages 343-348.
Patent Documents
  Patent Document 1: JP 2000-264790 A

SUMMARY OF THE INVENTION

This invention is intended to provide a method of manufacturing a SiC single crystal which can stably realize manufacture of a SiC single crystal substrate or thin film having a low carrier density which is suitable as a substrate for light emitting devices or electronic devices or as an active layer for power devices, using a practical crystal growth apparatus which can be used at atmospheric pressure in order to avoid vaporization of the solvent and which can be scaled up.

The present inventors found that incorporation of nitrogen into a SiC single crystal during growing by the liquid phase growth method at atmospheric pressure can be significantly suppressed by growing a SiC single crystal from a SiC solution consisting essentially of Si—Cr—Ti—C and having a composition within a prescribed range, thereby making it possible to stably grow a SiC single crystal (in the form of a thin film or a bulk single crystal) having a low nitrogen concentration which could not be realized in the prior art and hence having a carrier density controlled to at most $5 \times 10^{17}/cm^3$.

The present invention is a method of manufacturing a SiC single crystal comprising immersing a seed crystal in a SiC solution having C dissolved in a solvent which is a melt of a Si alloy and growing a SiC single crystal on the seed crystal by making the SiC solution supersaturated at least in the vicinity of the seed crystal due to supercooling, characterized in that the Si alloy is an alloy having a composition expressed by $Si_xCr_yTi_z$, wherein x, y, and z (each indicating atomic percent) satisfy $$0.50<x<0.68, 0.08<y<0.35, \text{ and } 0.08<z<0.35, \text{ or} \qquad (1)$$

$$0.40<x\leq0.50, 0.15<y<0.40, \text{ and } 0.15<z<0.35. \qquad (2)$$

The subscripts x, y, and z preferably satisfy $0.53<x<0.65$, $0.1<y<0.3$, and $0.1<z<0.3$. The SiC solution is preferably maintained in an inert gas atmosphere at atmospheric pressure.

The present invention also provides a SiC epitaxial wafer having a thin film of a SiC single crystal manufactured by the above method on a single crystal substrate. The carrier density of the SiC single crystal thin film in this wafer is preferably at most $5 \times 10^{17}/cm^3$.

The carrier density is the net carrier density expressed by Nd—Na, namely, [electron donor density (Nd) minus electron acceptor density (Na)]. In the case of SiC, electron donors are almost entirely nitrogen, and there are almost no electron acceptors. Therefore, the carrier density almost entirely corresponds to the nitrogen concentration. As carriers are nearly all electron donors, the CV (capacitance-voltage characteristics) measuring method is suitable for measuring the carrier density.

According to the present invention, by employing the liquid phase growth method using a SiC solution which has C dissolved in a molten alloy of Si, Cr, and Ti and which has a prescribed composition, it is possible to suppress incorporation of nitrogen into a SiC single crystal during crystal growth. As a result, it is possible to grow a SiC single crystal having a carrier density controlled to at most $5 \times 10^{17}/cm^3$.

The reason why this result can be achieved is conjectured to be as follows. Ti in a melt of a Si—Cr—Ti alloy which constitutes a solvent has a large affinity for nitrogen. Therefore, nitrogen which is dissolved in the melt from the atmosphere is captured by Ti as nitrides, whereby incorporation of nitrogen in the SiC crystal can be suppressed. Cr increases the activity of Ti in capturing nitrogen in the melt and promotes the more effective capture of nitrogen into the melt by Ti. In this manner, the amount of nitrogen in a SiC single crystal which crystallizes can be decreased such that the carrier density becomes at most $5 \times 10^{17}/cm^3$.

This effect of lowering the carrier density which is thought to be based on capture of nitrogen is not observed when the melt in which C is dissolved is constituted by Si alone, by a Si—Ti alloy, or a Si—Cr alloy, and it is observed only in a melt of a Si—Cr—Ti alloy having a prescribed composition. Accordingly, this phenomenon cannot be predicted from Document 1 which discloses growth of a SiC single crystal using a Si—M alloy (wherein M is a single transition metal).

Even when the solvent is a melt of a Si—Cr—Ti alloy, it is sometimes not possible to suppress incorporation of nitrogen in a SiC single crystal. As a result of investigation of the relationship of the amount of nitrogen which is incorporated in a SiC single crystal and the carrier density which is determined by the amount of nitrogen with the composition of a Si—Cr—Ti alloy (x, y, and z in $Si_xCr_yTi_z$), the present inventors found that incorporation of nitrogen in a SiC single crystal being grown is effectively suppressed and the carrier density decreases only when the composition of the Si—Cr—Ti alloy satisfies the following conditions:

$$0.50<x<0.68, 0.08<y<0.35, \text{ and } 0.08<z<0.35, \text{ or} \qquad (1)$$

$$0.40<x\leq0.50, 0.15<y<0.40, \text{ and } 0.15<z<0.35. \qquad (2)$$

In the present invention, by employing the liquid phase growth method (namely the LPE method or the solution growth method) utilizing a practical SiC single crystal growth apparatus which maintains a melt in an inert gas atmosphere at atmospheric pressure without using a reduced pressure, it is possible to stably and efficiently grow a SiC single crystal which can be used in many applications including electronic devices and light emitting elements while suppressing the carrier density to at most $5\times10^{17}/cm^3$ and advantageously to less than $1\times10^{17}/cm^3$ while suppressing coloration.

A manufacturing method for a SiC single crystal according to the present invention can be applied either to manufacture of a bulk (self-supporting) single crystal or to manufacture of a single crystal thin film grown on a single crystal substrate.

By growing a SiC single crystal thin film on a single crystal substrate in accordance with the method of the present invention, it is possible to efficiently manufacture a large wafer with an epitaxial film having a low carrier density and little coloration. A SiC single crystal thin film manufactured in this manner is useful as an active layer for power devices such as MOSFETs.

Similarly, a SiC bulk single crystal obtained by growing a thick SiC single crystal on a seed crystal by the method of the present invention also has a low carrier density and little coloration. Accordingly, when such a single crystal is used as a substrate of a light emitting element for growing thereon a thin film of a light emitting diode of GaN or the like, light can be emitted from the rear surface of the substrate, and the substrate can be utilized as a substrate for lighting equipment.

BRIEF EXPLANATION OF THE DRAWING

FIG. 1 is a schematic view showing the basic structure of a single crystal manufacturing apparatus (crystal growth apparatus) used in an example of the present invention.

EMBODIMENTS OF THE INVENTION

A method of manufacturing a SiC single crystal according to the present invention can be carried out in accordance with the liquid phase growth techniques known in the art (the solution growth method or the LPE method) except that the melt used as a solvent for dissolving C is a Si—Cr—Ti alloy having a prescribed composition.

When manufacturing a SiC single crystal by the liquid phase growth method according to the present invention, a SiC solution constituted by a melt containing Si, Cr, Ti, and C (a solution in which SiC can grow on a seed crystal) is prepared. This SiC solution is prepared by dissolving C in a melt of a Si—Cr—Ti alloy. In order to grow a single crystal from this SiC solution, it is necessary to achieve a state in which the SiC concentration in the solution (the concentration of dissolved C) is at or near saturation.

This SiC solution can be prepared by, for example, charging Si, Cr, and Ti in a predetermined proportion into a graphite crucible, heating the crucible to form a melt of the content, and continuing heating to dissolve C from the graphite crucible into the melt. It is a method in which C is supplied to the melt in the crucible from a carbonaceous crucible such as a graphite crucible. This method is preferable in that undissolved carbon which can serve as nuclei for crystallization of SiC does not remain in the melt. However, because the crucible is consumed, the frequency of replacement of the crucible increases. Instead of a graphite crucible, it is possible to use a crucible having at least its inner surface coated with SiC and to supply C by dissolving C from the SiC on the inner surface of the crucible.

Other methods of supplying C are also possible. One method is a method employing a gas phase in which a hydrocarbon gas (such as methane or propane) is blown into a melt in a crucible or is introduced into a gas atmosphere in a crucible. The hydrocarbon gas decomposes due to contact with the melt, and C which is produced by the decomposition is dissolved in the melt. It is also possible to use a method in which a solid carbon source is charged into a melt of a Si alloy and dissolved therein. These methods can use a non-consumable crucible. As a solid carbon source, it is possible to use graphite in block, rod, granule, or powder form, as well as non-crystalline carbon materials other than graphite, SiC, and carbides of Cr and Ti. It is also possible to supply C by combining two or more of the above-mentioned methods.

The heating temperature should be at least the liquidus temperature of the mixture of Si, Cr, and Ti which is charged into the crucible. Heating is continued until the concentration of SiC in the melt formed by dissolving the graphite crucible or supplied from an added carbon source reaches a saturated concentration or close thereto. When a solid carbon source and particularly a carbon source in the form of powder or granules is added to the crucible, if the solid carbon source remains in the melt without dissolving, SiC crystals may crystallized out on the solid carbon source, thereby decreasing the speed of the growth of the SiC single crystal and worsening the quality of the grown crystal. Therefore, heating is preferably continued so that the added carbon source completely dissolves. The length of heating of the melt is typically in the range from 1 hour to around 10 hours.

The heating atmosphere and the atmosphere inside the crystal growth apparatus during single crystal growth is preferably an inert gas atmosphere at atmospheric pressure, but it is also possible to use a pressurized or reduced pressure atmosphere. However, heating at a reduced pressure or in a vacuum is not desirable because it causes rapid consumption of the melt due to vaporization, and crystals cannot be stably grown. An inert gas atmosphere preferably consists essentially of one or more rare gases (such as helium or argon).

Crystal growth by the liquid phase growth method typically employs a method in which a seed crystal is maintained in a temperature gradient condition such that just the vicinity of the seed crystal is in a supercooled state (and accordingly in a supersaturated state) (referred to below as a temperature gradient method) since this method makes it possible to continuously grow a single crystal. The method of the present invention is preferably carried out by employing this temperature gradient method. The temperature gradient method is suitable for the manufacture of a bulk single crystal. However, by limiting the length of time for which growth takes place, it is also possible to manufacture an epitaxial wafer which is formed by growing a single crystal thin film on a substrate.

It is also possible to employ a method in which an entire solution in which a seed crystal is immersed is gradually cooled so as to become supercooled and form a supersaturated state, thereby growing a single crystal (referred to below as a gradual cooling method). The gradual cooling method is particularly suitable for the manufacture of a thin film single crystal. The gradual cooling method can be employed to manufacture a bulk single crystal by repeating a procedure including lifting up of the seed crystal after crystal growth, heating, immersion of the seed crystal in the SiC solution, and cooling, although energy losses are large.

With either method, a seed crystal is immersed in a high temperature SiC solution prepared by dissolving C in a melt of a Si—Cr—Ti alloy and a supersaturated state is created by supercooling in the entire solution or at a location of the solution in the vicinity of a SiC single crystal substrate to grow SiC crystals on the seed crystal. When growing a SiC single crystal thin film, the seed crystal is a single crystal substrate (also referred to below as a seed crystal substrate).

The resulting SiC single crystal can be used as a single crystal substrate in the form of a self-supporting crystal (bulk single crystal), and in particular it can be used as a substrate for a light emitting element. When a SiC single crystal thin film is deposited on a SiC single crystal substrate, the resulting substrate can be used as a SiC epitaxial wafer for a power device having an active layer.

All types of crystal polytypes of SiC single crystals such as 6H, 4H, 3C, and the like can be used as a seed crystal (including a seed crystal substrate for thin film growth). 4H—SiC is preferable for power devices, and 6H—SiC is preferable for light emitting elements. In some applications, it is also possible to form a SiC thin film by heteroepitaxial growth on a seed crystal substrate made of a material other than SiC, such as sapphire, Si, or SOL Accordingly, a seed crystal and a seed crystal substrate are not limited to a SiC single crystal.

A SiC seed crystal substrate can be formed from a SiC bulk single crystal grown by the sublimation method. SiC bulk single crystals manufactured by the sublimation method contain crystal defects such as through hole defects referred to as micropipe defects, screw dislocations, stacking faults, and the like, and therefore they are unsuitable for use as devices. However, as a SiC single crystal thin film grown by the LPE method according to the present invention on such a substrate does not contain any of the above-described defects, it can be used for the above applications as a substrate having an epitaxial film.

When a seed crystal substrate is a SiC single crystal substrate, it is preferable to immerse its {0001} plane (referred to as the on-axis plane) or a plane inclined with respect to the {0001} plane (referred to as an off-axis plane) in a high temperature SiC solution and grow a SiC single crystal on this plane. These planes are typically used to form electronic devices, so the conditions for forming them into devices and the like are well established, and polishing and processing of a substrate is easiest on these planes.

In the present invention, the Si—Cr—Ti alloy which serves as a solvent has a composition satisfying one of the following conditions when expressed as $Si_xCr_yTi_z$:

$$0.50 < x < 0.68, \ 0.08 < y < 0.35, \text{ and } 0.08 < z < 0.35, \text{ or} \quad (1)$$

$$0.40 < x \leq 0.50, \ 0.15 < y < 0.40, \text{ and } 0.15 < z < 0.35. \quad (2)$$

Only when the solvent is a Si—Cr—Ti alloy having a composition which satisfies this condition, incorporation of nitrogen in the SiC single crystal which is grown is greatly suppressed, and it becomes possible to grow a transparent SiC single crystal of high resistance with its carrier density being a low value of at most $5 \times 10^{17}/cm^3$. In particular, when it is desired to decrease the carrier density to less than $1 \times 10^{17}/cm^3$, the composition preferably satisfies $0.53 < x < 0.65$, $0.1 < y < 0.3$, and $0.1 < z < 0.3$.

The above-described alloy composition was determined by repeated experiments based on a Si—Ti—Cr ternary phase diagram. The theoretical basis for the effects of these compositions is unclear, but as stated above, it is conjectured that the chemical affinity between Ti and nitrogen and the effect of Cr on increasing the activity of Ti are related to these effects.

If the proportions of Ti or Cr are too low or if the proportion of Si is too high, it is not possible to adequately suppress incorporation of nitrogen in the crystal during growth, and it is not possible to manufacture a high resistance SiC single crystal with a carrier density of at most $5 \times 10^{17}/cm^3$. If the Cr content is too high, incorporation of nitrogen becomes large. On the other hand, if the Ti content becomes too high, the amount of incorporation of nitrogen becomes large, and the crystal growth speed becomes slow due to a decrease in the amount of dissolved C.

One example of a typical single crystal manufacturing apparatus (crystal growth apparatus) which can be used to manufacture a SiC single crystal by the LPE method or the solution growth method is schematically shown in FIG. 1. The illustrated single crystal manufacturing apparatus comprises a crucible 2 in which a high temperature SiC solution 1 is contained. A seed crystal (a seed crystal substrate in the illustrated example) 4 which is held at the tip of a seed shaft 3 which can be lifted and lowered is immersed in the solution 1. The solution 1 is a SiC solution which is prepared by dissolving C in a melt of a Si—Ti—Cr alloy used as a solvent. As stated above, it is preferable to supply C to the melt using a graphite crucible as the crucible 2 by dissolving the crucible in order to eliminate with certainty the presence of undissolved carbon which becomes nuclei for crystallization of polycrystals. However, as is known in the art, it is possible to supply C by other means, so it is also possible to use a crucible other than a graphite crucible. As shown in the figure, the crucible 2 and the seed shaft 3 are preferably rotated. In the illustrated example, the rotational directions of the crucible 2 and the seed shaft 3 are opposite of each other, but they can also rotate in the same direction. The rotational speeds of one or both of the crucible and the seed shaft may be periodically varied, or rotation thereof may be temporarily interrupted.

The crucible 2 is substantially closed off by a crucible lid 5 through which the seed shaft passes, and the outer periphery of the crucible 2 is covered by a heat insulating material 6 for maintaining the temperature of the crucible. A high frequency coil 7 for inductive heating of the crucible and the SiC solution is disposed on the outer periphery of the heat insulating material 6. When carrying out crystal growth by the temperature gradient method, a temperature differential (a temperature gradient) in the vertical direction of the solution can be formed by adjusting the number and spacing of the windings of the high frequency coil as well as the positional relationship in the height direction between the high frequency coil 7 and the crucible 2. Alternatively or in addition thereto, heat can be dissipated from the melt through the seed shaft so that only the periphery of the substrate 4 can be cooled by incorporating a water cooling mechanism or a gas cooling mechanism into the seed shaft. In this case, a temperature gradient can be formed both in the horizontal and vertical directions.

Because the crucible 2, the heat insulating material 6, and the high frequency coil 7 reach a high temperature, they are disposed inside a water-cooled chamber 8. The water-cooled chamber 8 has a gas inlet 9 and a gas outlet 10 for adjusting the atmosphere inside the apparatus to be an inert gas atmosphere. A plurality of pyrometers may be disposed so as to pass through the gaps in the high frequency coil and through the heat insulating material 6 in order to measure the temperature of the side wall of the crucible 2 at a plurality of heights. As the temperature of the side wall of the crucible is substantially the same as the temperature of the SiC solution, heating by the high frequency coil 7 can be adjusted based on the measured temperatures. It is also possible to measure temperatures in the radial direction of the bottom of the crucible by making a crucible shaft 11 which holds the crucible hollow and inserting a plurality of thermocouples into the hollow shaft. The temperature distribution in the growth interface during crystal growth can be obtained by measuring the temperature at the surface of the seed shaft which contacts the rear surface of the seed crystal substrate which is immersed in the SiC solution. The temperature of the surface of the seed shaft which contacts the rear surface of the seed crystal substrate can be measured by inserting a plurality of thermocouples into the hollow seed shaft. The temperature distribution in the growth surface can be adjusted by, for example, disposing a heat insulating structure or structures above the free surface of the SiC solution 1 or adding a heat insulating structure or structures inside the seed shaft.

A supersaturated state of a SiC solution which is the driving force for crystal growth can be created just in the vicinity of the seed crystal substrate by the temperature gradient method, or it can be created by gradual cooling of the entire to SiC solution 1 in which the seed crystal substrate is immersed. In the gradual cooling method, SiC can be grown on a single crystal substrate by immersing a SiC single crystal substrate having the surface corresponding to the {0001} plane or inclined with respect to the {0001} plane in the SiC solution having a solvent formed from a melt of a Si—Cr—Ti alloy and gradually cooling the entire solution to a supercooled temperature to create a supersaturated state. Growth of a SiC single crystal on the substrate can be continued by terminating the gradual cooling of the SiC solution at a temperature higher than the solidus temperature of the solution, and repeating heating and gradual cooling of the SiC solution.

With either method, the surface layer of the seed crystal or the seed crystal substrate made from a SiC single crystal which has been immersed in the SiC solution is preferably dissolved in the solution prior to commencement of crystal growth. This is because a work-affected layer, a natural oxide film, or the like is present on the surface of a SiC single crystal, and it is necessary to remove such a layer or film prior to crystal growth.

EXAMPLES

In this example, an experiment of growth of a SiC single crystal thin film was carried out by the LPE method (temperature gradient method) using the single crystal manufacturing apparatus shown in FIG. 1.

This single crystal manufacturing apparatus had a crucible 2 of high purity graphite which had an inner diameter of 80 mm and a height of 150 mm and housed therein a SiC solution 1 in the form of a melt. The crucible 2 was disposed in a water-cooled stainless steel chamber 8. The outer periphery of the graphite crucible was surrounded by a heat insulating material 6 for heat retention, and a high frequency coil 7 for inductive heating was disposed around the heat insulating material 6. The temperature distribution in the height direction of the solution could be controlled by adjusting the number of windings of the high frequency coil, the spacing of the windings, and the positional relationship between the graphite crucible and the high frequency coil. The atmosphere within the single crystal manufacturing apparatus was adjusted to be an inert gas atmosphere (argon gas) at atmosphere pressure using a gas inlet 9 and a gas outlet 10. A crystal holder (seed shaft) 3 having a seed crystal substrate 4 mounted on its bottom surface had a water cooling mechanism incorporated into its interior.

The high purity graphite crucible 2 was charged with high purity Si, Cr, and Ti as raw materials in proportions to obtain a predetermined composition, and the raw materials inside the crucible were melted by inductive heating caused by passing a current through the high frequency coil 7. Carbon was supplied to the melt by dissolving the graphite crucible forming a vessel for the melt. Prior to starting the growth of a single crystal, heating of the melt was carried out for 2 hours at 1715° C. in order to dissolve carbon into the melt to a concentration sufficient for SiC single crystal growth. Heating by the high frequency coil was adjusted from this stage to produce a temperature gradient of 10° C./cm in the height direction of the solution so that the temperature at a predetermined immersion position of the seed crystal substrate in the solution (specifically, in the vicinity of the liquid surface) was lower than in the lower portion of the solution.

After a SiC solution 1 in which SiC growth was possible was formed in the crucible by the above-described heating, a 4H—SiC seed crystal substrate 4 which measured 25 mm×25 mm and had a surface inclined by 8° from the {0001} plane in the (11-20) direction and which was held at the tip of the seed shaft 3 was immersed in the vicinity of the surface of the solution 1. As a result, the SiC solution 1 in the vicinity of the seed crystal substrate locally became a lower temperature due to dissipation of heat through the water-cooled seed shaft 3. Accordingly, cooling due to heat dissipation in the vicinity of the substrate was added to the temperature gradient in the height direction due to heating, and temperature gradients both in the vertical direction and in the horizontal direction were formed such that the temperature of the solution 1 was lower in the vicinity of the seed crystal substrate in order to promote crystal growth. A SiC crystal growth experiment was carried out for 3 hours under these conditions. During this time, the crucible 2 and the seed shaft 3 were rotated in opposite directions from each other.

After the completion of the growth experiment, the seed shaft 3 was lifted, and the seed crystal substrate 4 was withdrawn from the solution 1 and recovered. The solution in the crucible was cooled to room temperature and solidified. The seed crystal substrate was washed with a hydrofluoric-nitric acid solution to remove any solidified matter of the solution adhering to the substrate. Upon a direct observation of a cross section of the seed crystal substrate 4 with an optical microscope, it was found that a SiC crystal was newly grown to a thickness ranging from several tens of micrometers to around 100 micrometers. The seed crystal substrate was then removed from the graphite jig (seed shaft) 3, and its surface was leveled by machining. The carrier density of the resulting single crystal thin film was determined by C—V measurement (using a CVmap92A). The results are shown in Table 1 [an example of above-described composition (1)] and Table 2 [an example of above-described composition (2)].

TABLE 1

| No. | Alloy composition (at %) | | | Growth temperature (° C.) | Growth period (hr) | Substrate | Film thickness (μm) | Carrier density [1E15] |
| --- | --- | --- | --- | --- | --- | --- | --- | --- |
| | Si | Cr | Ti | | | | | |
| 1 | 60 | 20 | 20 | 1715 | 3 | 4H—SiC | 60 | 5 |
| 2 | 60 | 15 | 25 | 1715 | 3 | 4H—SiC | 70 | 15 |
| 3 | 60 | 22 | 18 | 1715 | 3 | 4H—SiC | 75 | 11 |
| 4 | 55 | 20 | 25 | 1715 | 3 | 4H—SiC | 65 | 12 |
| 5 | 65 | 15 | 20 | 1715 | 3 | 4H—SiC | 75 | 18 |

TABLE 1-continued

| No. | Alloy composition (at %) Si | Cr | Ti | Growth temperature (° C.) | Growth period (hr) | Substrate | Film thickness (μm) | Carrier density [1E15] |
|---|---|---|---|---|---|---|---|---|
| 6 | 60 | 25 | 15 | 1715 | 3 | 4H—SiC | 70 | 28 |
| 7 | 55 | 25 | 20 | 1715 | 3 | 4H—SiC | 60 | 40 |
| 8 | 55 | 15 | 30 | 1715 | 3 | 4H—SiC | 65 | 52 |
| 9 | 65 | 20 | 15 | 1715 | 3 | 4H—SiC | 80 | 65 |
| 10 | 55 | 30 | 15 | 1715 | 3 | 4H—SiC | 60 | 98 |
| 11 | 60 | 30 | 10 | 1715 | 3 | 4H—SiC | 75 | 97 |
| 12 | 65 | 10 | 25 | 1715 | 3 | 4H—SiC | 70 | 102 |
| 13 | 65 | 25 | 10 | 1715 | 3 | 4H—SiC | 70 | 140 |
| 14 | 50 | 25 | 25 | 1715 | 3 | 4H—SiC | 40 | 210 |
| 15 | 60 | 10 | 30 | 1715 | 3 | 4H—SiC | 65 | 220 |
| 16 | 50 | 28 | 22 | 1715 | 3 | 4H—SiC | 70 | 230 |
| 17 | 50 | 20 | 30 | 1715 | 3 | 4H—SiC | 40 | 230 |
| 18 | 55 | 35 | 10 | 1715 | 3 | 4H—SiC | 50 | 320 |
| 19 | 50 | 30 | 20 | 1715 | 3 | 4H—SiC | 35 | 330 |
| 20 | 50 | 35 | 15 | 1715 | 3 | 4H—SiC | 45 | 480 |
| 21 | 55 | 10 | 35 | 1715 | 3 | 4H—SiC | 55 | 490 |
| 22 | 50 | 15 | 35 | 1715 | 3 | 4H—SiC | 45 | 490 |
| 23 | 70* | 15 | 15 | 1715 | 3 | 4H—SiC | 100 | 510 |
| 24 | 70* | 20 | 10 | 1715 | 3 | 4H—SiC | 90 | 640 |
| 25 | 70* | 10 | 20 | 1715 | 3 | 4H—SiC | 110 | 740 |
| 26 | 65 | 30 | 5* | 1715 | 3 | 4H—SiC | 70 | 870 |
| 27 | 60 | 35 | 5* | 1715 | 3 | 4H—SiC | 60 | 950 |
| 28 | 80* | 10 | 10 | 1715 | 3 | 4H—SiC | 120 | 1500 |
| 29 | 70* | 25 | 5 | 1715 | 3 | 4H—SiC | 105 | 1600 |
| 30 | 50 | 40* | 10 | 1715 | 3 | 4H—SiC | 45 | 1600 |
| 31 | 55 | 40* | 5* | 1715 | 3 | 4H—SiC | 50 | 2200 |
| 32 | 60 | 5* | 35 | 1715 | 3 | 4H—SiC | 76 | 820 |
| 33 | 53 | 38* | 9 | 1715 | 3 | 4H—SiC | 45 | 750 |
| 34 | 75* | 15 | 10 | 1715 | 3 | 4H—SiC | 115 | 1420 |
| 35 | 75* | 10 | 15 | 1715 | 3 | 4H—SiC | 124 | 1330 |
| 36 | 65 | 5* | 30 | 1715 | 3 | 4H—SiC | 65 | 690 |

*Outside the range of the present invention

TABLE 2

| No. | Alloy composition (at %) Si | Cr | Ti | Growth temperature (° C.) | Growth period (hr) | Substrate | Film thickness (μm) | Carrier density [1E15] |
|---|---|---|---|---|---|---|---|---|
| 1 | 48 | 37 | 15 | 1720 | 3 | 4H—SiC | 75 | 120 |
| 2 | 43 | 38 | 19 | 1720 | 3 | 4H—SiC | 80 | 105 |
| 3 | 42 | 36 | 22 | 1720 | 3 | 4H—SiC | 65 | 122 |
| 4 | 47 | 32 | 21 | 1720 | 3 | 4H—SiC | 60 | 111 |
| 5 | 42 | 32 | 26 | 1720 | 3 | 4H—SiC | 75 | 132 |
| 6 | 60 | 25 | 15 | 1720 | 3 | 4H—SiC | 85 | 128 |
| 7 | 47 | 28 | 25 | 1720 | 3 | 4H—SiC | 90 | 155 |
| 8 | 42 | 26 | 32 | 1720 | 3 | 4H—SiC | 70 | 186 |
| 9 | 43 | 23 | 34 | 1720 | 3 | 4H—SiC | 75 | 193 |
| 10 | 43 | 19 | 38 | 1720 | 3 | 4H—SiC | 65 | 205 |
| 11 | 45 | 45* | 10* | 1720 | 3 | 4H—SiC | 110 | 580 |
| 12 | 40 | 45* | 15 | 1720 | 3 | 4H—SiC | 85 | 630 |
| 13 | 38* | 40 | 22 | 1720 | 3 | 4H—SiC | 100 | 590 |
| 14 | 37* | 35 | 28 | 1720 | 3 | 4H—SiC | 95 | 780 |
| 15 | 35* | 30 | 35 | 1720 | 3 | 4H—SiC | 75 | 880 |
| 16 | 40 | 20 | 40* | 1720 | 3 | 4H—SiC | 105 | 1700 |
| 17 | 45 | 15 | 40* | 1720 | 3 | 4H—SiC | 85 | 1850 |

*Outside the range of the present invention

As can be seen from Tables 1 and 2, by using a SiC solution in which the solvent is a melt of a Si—Ti—Cr alloy with a prescribed composition in accordance with the present invention, it was possible to grow at atmospheric pressure a SiC single crystal thin film having a low carrier density of at most $5 \times 10^{17}/cm^3$ and hence having a resistance suitable for application to electronic devices. In particular, in Nos. 1-11 of Table 1, the alloy composition was a preferred composition satisfying the conditions $0.53<x<0.65$, $0.1<y<0.3$, and $0.1<z<0.3$, and it was possible to grow a SiC single crystal thin film having a reduced carrier density of less than $1 \times 10^{17}/cm^3$ and a higher resistance.

Each of these SiC films was transparent and at most only slightly colored. In particular, those films for which the alloy composition of the melt was within the above-described preferred range were substantially colorless and coloration was extremely slight if any.

In contrast, when the proportions of any of the alloying elements Si, Cr, and Ti were outside of the range of the present invention, the carrier density of the SiC single crystals which were grown exceeded $5 \times 10^{17}/cm^3$, so the electrical conductivity of the crystals became high, and the coloration became stronger.

In the above description, preferred modes and examples of the present invention have been explained, but the above explanation is in all respects merely exemplary and is of course not limiting. The scope of the present invention is limited only by the claims.

The invention claimed is:

1. A method of manufacturing a SiC single crystal comprising immersing a seed crystal in a SiC solution having C dissolved in a solvent which is a melt of a Si alloy and growing a SiC single crystal on the seed crystal by making the SiC solution supersaturated at least in the vicinity of the seed crystal due to supercooling, characterized in that the Si alloy is an alloy having a composition which is expressed by $Si_xCr_yTi_z$ wherein x, y, and z (each in atomic percent) satisfy $0.50<x<0.68, 0.08<y<0.35,$ and $0.08<z<0.35$, or (1)

$0.40<x<0.50, 0.15<y<0.40,$ and $0.15<z<0.35.$ (2)

2. A method of manufacturing a SiC single crystal as set forth in claim 1 wherein x, y, and z satisfy $0.53<x<0.65$, O.K $y<0.3$, and O.K $z<0.3$.

3. A method of manufacturing a SiC single crystal as set forth in claim 1 wherein the SiC solution is maintained in an inert gas atmosphere at atmospheric pressure.

4. A method of manufacturing a SiC single crystal as set forth in claim 2 wherein the SiC solution is maintained in an inert gas atmosphere at atmospheric pressure.

* * * * *